Aug. 24, 1965 A. OSWALD 3,202,755

WELDED CIRCUIT ASSEMBLY AND METHOD OF ASSEMBLY

Filed Aug. 30, 1961

ANTON OSWALD
INVENTOR.

BY S. A. Giarratana
George B. Oujevolk
ATTORNEYS

United States Patent Office 3,202,755
Patented Aug. 24, 1965

3,202,755
WELDED CIRCUIT ASSEMBLY AND METHOD OF ASSEMBLY

Anton Oswald, Bloomfield, N.J., assignor to General Precision Inc., Little Falls, N.J., a corporation of Delaware
Filed Aug. 30, 1961, Ser. No. 135,055
6 Claims. (Cl. 174—68.5)

This invention relates to electronic circuit packages and more particularly to an electronic circuit package in which the connections between circuit components are provided by welding, to the method of manufacture of this circuit package, and to articles of manufacture used in this method.

Prior to the present invention, welded electronic circuit packages were manufactured by forming nickel ribbon wire in the shape of the interconnections between the circuit components and welding the circuit component leads to the nickel ribbon wire. The basic disadvantage of this method is that it is time-consuming. Extra handling of parts is required in that the ribbon wire must be formed from one point of connection to the next in the welding operation and the ribbon wire must be cut after the welding has been completed.

Another method of the prior art makes use of a deposited circuit on a board. The circuit components are welded to tabs formed as a part of the deposited circuit. This method is unsatisfactory because the board on which the deposited circuit is formed is brittle, and the deposited circuit does not adhere to the board very well. This makes the welded circuit difficult and troublesome both to manufacture and to repair. The deposited circuit often peels off during the welding operation and when the welded circuit is being repaired. Because the conductors of the deposited circuit are closely spaced, the circuit usually shorts whenever any peeling occurs. Moreover, the tabs of the deposited circuit occasionally break off, which necessitates the use of ribbon wire to complete the manufacture of the welded circuit package.

The present invention avoids the disadvantages of the prior art by facilitating the use of a printed circuit as part of the welded circuit package. Prior to the present invention it was known to solder components directly to a printed circuit, but there was no satisfactory way of using printed circuits as part of welded circuit packages.

According to the invention the leads of the components of the circuit package are electrically connected to a printed circuit, which provides the necessary interconnections between the component leads for the circuit package. The component leads are welded to weldable pins which are used as electrical connectors to the printed circuit. In one embodiment of the invention each welded connection between a component lead and the printed circuit is made by pressing the pin through the printed circuit board and through the printed circuit formed on the board. In this embodiment each pin is formed with tapered splines, which dig into the printed circuit board and into the printed circuit. This action by the splines secures the pins against rotation and provides good electrical contact between the pins and the printed circuit. The ends of the pins are then peened to secure the pins against axial movement. The component lead is inserted through a hole in the printed circuit board adjacent the pin and welded to the pin.

According to a second embodiment of the invention, the component leads are welded to the printed circuit by means of hollow pins, which are inserted through the printed circuit board and through the printed circuit. Each hollow pin is formed with a tapered knurled surface, which digs into the printed circuit and secures the pin in position. The component leads are inserted into the hollow pins and welded thereto.

According to a third embodiment of the invention, the printed circuit board is provided with plated through holes with metallic, electrically conducting pads surrounding the plated through holes on both sides of the printed circuit board. The weldable pins are formed by cutting short sections of nickel ribbon wire and forming each section in the shape of an L. The L-shaped pins are inserted through the plated through holes and the short legs of the pins are engaged with the printed circuit pads and electrically welded thereto. The welding is made possible because of circuit continuity between both sides of the printed circuit board through the plated through hole. The long legs of the L-shaped pins, extending through the plated through holes, are then welded to the component leads.

With these above described methods of manufacturing welded circuit packages, the time for manufacturing the welded circuit packages is greatly reduced. For example, the circuit components of a 5-watt amplifier can be fabricated into a welded circuit package with the methods of the invention in ten or fifteen minutes, whereas it takes from two to two-and-a-half hours to form this welded circuit package with the methods of the prior art.

Accordingly, a principal object of the present invention is to reduce the time for manufacturing welded circuit packages.

Another object of the present invention is to provide an improved method of manufacturing welded circuit packages.

A further object of the present invention is to provide improved welded circuit packages.

A still further object of the present invention is to provide welded circuit packages which can be manufactured in greatly reduced time.

Further objects and advantages of the present invention will become readily apparent as the following detailed description of the invention unfolds, and when taken in conjunction with the drawings, wherein.

Figure 1:
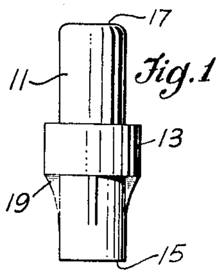
FIG. 1 is a view in elevation of the pin used in one embodiment of the invention.
Figure 2:
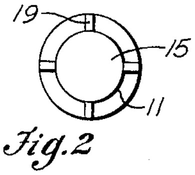
FIG. 2 is a bottom plan view of the pin shown in FIG. 1.

As shown in FIGS. 1 and 2, the pin used in the first embodiment of the invention comprises a solid cylindrical body 11 made of weldable material and having a flange 13 located between its ends 15 and 17. Four tapered splines 19 are formed beneath the flange 13 spaced at regular angular intervals about the axis of the cylindrical body 11. The splines 19 lie in planes passing through the axis of the cylindrical body and have one inner edge fixed to the cylindrical body 11 and the other inner edge fixed to the lower surface of the flange 13. The outer edge of each of the splines 19 tapers outwardly from the body 11 to the outer peripheral edge of the flange 13. The assembly of the flange 13 and the splines 19 is formed on the cylindrical body 11 by upsetting so that the flange 13, the splines 19 and the cylindrical body 11 are all one integral piece.

Figure 3:
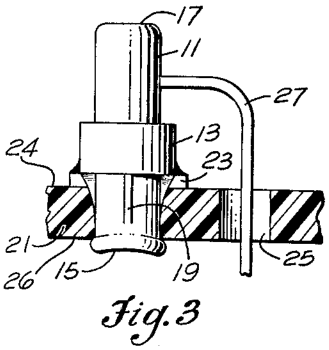
FIG. 3 is a view in partial section illustrating how a component lead is connected to a printed circuit by means of the pin shown in FIGS. 1 and 2.

As illustrated in FIG. 3, the pin shown in FIGS. 1 and 2 is used to connect a component lead to the printed circuit by pressing the bottom end 15 of the pin through a hole in a printed circuit board 21. The hole is just large enough to accommodate the cylindrical body 11 of the pin. The printed circuit is formed on the side 24 of the board 21. The hole through which the pin is inserted is surrounded on the side 24 by an electrically conducting metallic pad 23, which is part of the printed circuit. The pin is inserted through the hole in the printed circuit board 21 from the side 24 and is pushed through the hole until the splines 19 engage the pad 23. The pin is then forced further into the hole and the splines 19 dig into the pad 23 and the board 21. This action causes the metal from the pad 23 to be displaced into the hole and results in a good electrical contact between the pin and the pad 23. The splines forced into the pad 23 and the board 21 in this manner also secure the pin against rotational movement. The pin will be inserted far enough into the hole until the end 15 passes all the way through the board 21. The end 15 is then peened to secured the pin against axial movement. After the pin has been peened, the circuit connection between the pin and the pad 23 will be maintained even if the pin should subsequently loosen.

The components of the welded circuit package will be positioned on the opposite side 26 of the board 21 from the printed circuit. The component lead 27 which is to be connected to the printed circuit at the pad 23 is inserted through a hole 25 adjacent the pin. The component lead 27 is then welded to the cylindrical body 11 of the pin. In this manner a welded electrical connection is provided between the component lead 27 and the pad 23.

Figure 4:
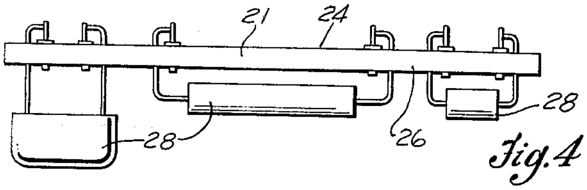
FIG. 4 illustrates an example of a welded circuit package in which the component leads are connected to the printed circuit as shown in FIG. 3.

The complete welded circuit package shown in FIG. 4 is provided by connecting the leads of the components 28 of the circuit package to pads on the board 21 in the manner described with reference to FIG. 3. The printed circuit on the board 21 is formed to interconnect the pads in such a manner as to provide the necessary interconnections between the component leads for the circuit package.

A thin coating of non-conductive epoxy can be applied over the pins after they are peened, prior to encapsulating the entire unit, to further secure the pins to the board and enable the components to be sandwiched between two boards without danger of breaking an electrical connection between a pin and a pad. As a further precaution a conductive epoxy cement can be applied to the pins prior to the application of the non-conductive epoxy to ensure the maintaining of a good electrical connection between the pins and the pads. The assembly of the pins could also be plated or soldered to the pads instead of using conductive epoxy cement.

Figure 6:
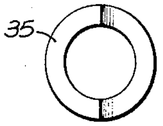
FIG. 6 is a top plan view of the pin in FIG. 5.
Figure 5:
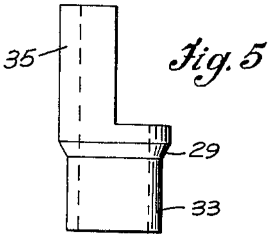
FIG. 5 is a view in elevation of the pin used in a second embodiment of the invention.

As shown in FIGS. 5 and 6, the pin used in the second embodiment of the invention comprises a hollow cylindrical body made of weldable material and having a knurled tapered annular surface between its ends interconnecting the upper part 35 of the pin with the lower part 33 of the pin. A semicircular segment of the upper part 35 of the pin is cut away to form a welding tab 35'. The lower part 33 is of smaller diameter than the upper part 35 and the knurled surface 29 tapers out from the part 33 to the part 35. The inner cylindrical wall of the pin is of constant diameter throughout the length of the pin.

Figure 7:
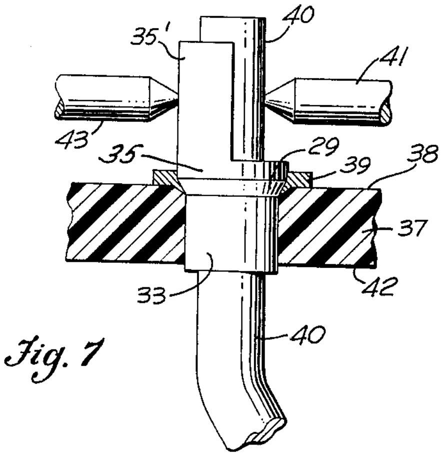
FIG. 7 is a view in partial section illustrating how a component lead is connected to the printed circuit by means of the pin shown in FIGS. 5 and 6.

When this pin is used to connect a component lead to a printed circuit, the pin is inserted, lower part 33 first, through a hole in a printed circuit board 37, as shown in FIG. 7. The printed circuit is formed on the side 38 of the board 37. The hole through which the pin is inserted is just large enough to accommodate the part 33 of the pin. The hole is surrounded on the side 38 of the board 37 by an electrically conductive metallic pad 39 forming part of the printed circuit. The pin is inserted through the hole from the side 38 of the board 37 until the knurled surface 29 engages the pad 39. The pin is then first forced further into the hole so that the knurled surface 29 digs into the pad 39 and carries some of the metal from the pad 39 into the hole. In this manner the pin is secured firmly in the hole and a good electrical connection is provided between the pad 39 of the printed circuit and the pin.

The components to be connected into a circuit package by the printed circuit on the board 37 will be positioned on the opposite side 42 of the board 37 from the printed circuit. The lead 40 of the component to be connected to the printed circuit at the pad 39 is inserted through the hollow pin from the side 42. The cylindrical inner walls of the pin are designed to accept component leads of various diameters. The component lead 40 is then electrically welded to the pin by means of electrodes 41 and 43. To perform the welding operation the electrode 41 is positioned against the component lead 40 where the segment has been cut away from the upper portion 35 of the pin and the electrode 43 is positioned opposite the electrode 41 against tab 35' of the pin. In this manner a welded electrical connection is provided between the component lead 40 and the pad 39 of the printed circuit.

In the event that the replacement of components is desired, the semicircular section shown in FIGURE 5 is not cut away, instead of the component lead is brought over the top of the pin, bent in a hairpin turn and welded to the outside of the pin. This permits the clipping off of the component lead.

Figure 8:
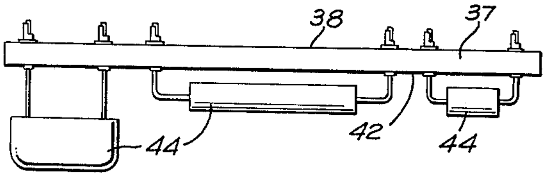
FIG. 8 illustrates an example of a welded circuit package in which the leads are connected to the printed circuit package as shown in FIG. 7.

The complete welded circuit package illustrated in FIG. 8 is provided by connecting the leads of the components 44 of the circuit package to pads on the board 37 in the manner described with reference to FIG. 7. The printed circuit on the board 37 is formed to interconnect the pads in such a manner as to provide the necessary interconnections between the component leads for the welded circuit package.

Figure 9:
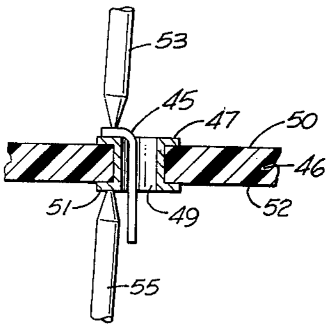
FIG. 9 illustrates how a component lead is connected to a printed circuit in a third embodiment of the invention.

In the third embodiment of the invention, as shown in FIG. 9, each connection between a component lead and the printed circuit is made by cutting a short section of nickel ribbon wire and bending the section into an L-shaped pin 45. The printed circuit in this embodiment is formed on the side 50 of a printed circuit board 46. The board 46 is provided with a plated through hole 49 surrounded on the side 50 of the board 46 with a metallic, electrically conductive pad 47 forming part of the printed circuit and is surrounded on the opposite side 52 from the printed circuit with a metallic, electrically conductive pad 51. The metal plated on the walls of the through hole 49 provides an electrical connection between the pads 47 and 51. The short leg of the L-shaped pin 45 is engaged with the pad 47 and is electrically welded thereto with the log leg of the pin 45 extending through the plated through hole 49. The electrical welding operation is carried out by means of electrodes 53 and 55. The electrode 53 is engaged with the short leg of the pin 45 opposite where the short leg engages the pad 47 and the electrode 55 is engaged with the pad 51 opposite the electrode 53. Welding in this manner is made possible because an electrical connection between the electrodes 53 and 55 is provided through the board 46 by the metal plated on the walls of the plated through hole 49. The components of the welded circuit package are positioned on the side 50 of the printed circuit board 46. After the short leg of the pin 45 is welded to the pad 47, the long leg of the pin 45, extending through the plated through hole 49, is welded to the component lead to be connected to the printed circuit at the pad 47. In this manner an electrical connection is provided between the component lead and the pad 47.

Figure 10:
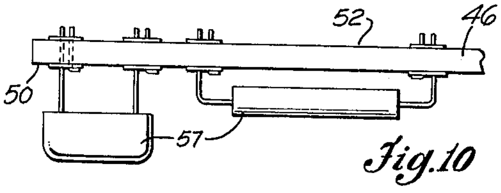
FIG. 10 illustrates an example of a welded circuit package in which the leads are connected to the printed circuit as shown in FIG. 9.

The complete welded circuit package shown in FIG. 10 is provided by connecting the leads of the components 57 to pads on the board 46 in the manner described with reference to FIG. 9. The printed circuit on the side 50 of the board 46 is formed to interconnect the pads in such a manner as to provide the necessary interconnection between the component leads for the circuit package.

For convenience of illustration, the drawings depict the components as being mounted in the horizontal plane and on one board. In practice, the sandwich technique is used. The components are mounted between two printed circuit boards disposed in parallel planes. Depending on the size and shape of the component, the component is mounted either at right angles or parallel to the plane of the circuit boards.

It is to be observed that as used herein the expression "pad" merely refers to a portion of the conductor of the printed circuit which is pierced to receive the pin herein described.

Although for the purpose of illustration, resistance welding is depicted in the drawing, other methods of welding may likewise be used.

The above description is of preferred embodiments of the invention, and many modifications may be made thereto without departing from the spirit and scope of the invention.

What is claimed is:

1. A device for connection of a wire conductor to a printed circuit consisting of a generally tubular body of weldable material having three continuous coaxial segments, one end segment being of cylindrical configuration, the intermediate segment having a knurled outer surface of frusto-conical form tapering outwardly from an end of said one segment, the other end segment being cylindrical over a minor portion of its length adjoining said intermediate segment, the remaining length portion of said other end segment being a sector of a hollow cylinder.

2. In combination, a printed circuit board of electrically-insulating material having a conductive layer on a major surface thereof; a device in accordance with claim 1 mounted on said board with its cylindrical segment inserted in an aperture extending through said board and layer and its knurled frusto-conical surface engaging said layer around said aperture; and a wire conductor inserted through the tubular body of said device and welded to said other end segment thereof.

3. The combination claimed in claim 2, in which said aperture in the board and layer is narrower in diameter opposite the layer than opposite the board for bending the edge of the layer over the edge of the board during insertion of the tubular body.

4. The combination claimed in claim 2, in which the board has a beveled edge around the aperture underlying the portion of the layer disposed adjacent thereto for forming a frusto-conical lip on the edge of the layer during insertion of the tubular body.

5. The combination claimed in claim 2, in which the knurled outer surface of the tubular body has ridges having a ridge depth not greater than a fraction of the thickness of the portion of the layer disposed adjacent thereto for preventing cutting through of the layer when inserting the tubular body in the aperture.

6. A method of electrically connecting a component lead at the back to a printed circuit at the front side of a printed circuit board comprising the steps of, providing a hole through the printed circuit board surrounded by a pad of the printed circuit, inserting a hollow tubular pin having a cylindrical lower portion of substantially the same diameter as the hole, and having a coaxial tapered intermediate portion with a knurled outer surface and a coaxial arcuate semi-cylindrical upper portion through the front side of the printed circuit board in such a manner as to drive said cylindrical lower portion into said board and as to dig said tapered portion into said printed circuit, inserting a component lead into said hollow pin through the back and out the front side, and welding said component lead to said arcuate semi-cylindrical upper portion of said hollow pin.

References Cited by the Examiner

UNITED STATES PATENTS

| | | | |
|---|---|---|---|
| 1,648,605 | 11/27 | Bobo. | |
| 2,915,678 | 12/59 | Frazier et al. | 29—155.55 X |
| 2,982,883 | 5/61 | Gordy | 29—155.55 X |
| 3,025,591 | 3/62 | Markowitz | 29—155.55 |
| 3,093,887 | 6/63 | Prestige et al. | 29—155.55 |
| 3,098,951 | 7/63 | Ayers et al. | 174—68.5 X |

OTHER REFERENCES

"Electronics," magazine published Oct. 23, 1959, pages 146 and 148.

WHITMORE A. WILTZ, *Primary Examiner.*

JOHN P. CAMPBELL, *Examiner.*